United States Patent
Berberich et al.

(10) Patent No.: US 7,339,796 B2
(45) Date of Patent: Mar. 4, 2008

(54) ELECTRICAL CIRCUIT HAVING A MULTILAYER PRINTED CIRCUIT BOARD

(75) Inventors: Reinhold Berberich, Frankfurt (DE); Dieter Busch, Rosbach (DE); Albert Zintler, Groβ-Gerau (DE)

(73) Assignee: Siemens Aktiengesellschaft, München (DE)

( * ) Notice: Subject to any disclaimer, the term of this patent is extended or adjusted under 35 U.S.C. 154(b) by 187 days.

(21) Appl. No.: 11/245,232

(22) Filed: Oct. 6, 2005

(65) Prior Publication Data

US 2006/0082976 A1   Apr. 20, 2006

(30) Foreign Application Priority Data

Oct. 11, 2004   (DE) .................. 10 2004 049 485

(51) Int. Cl.
*H05K 1/18* (2006.01)

(52) U.S. Cl. .............. 361/763; 361/720; 361/728; 361/794; 257/E23.114; 257/678; 257/704; 174/255; 174/260; 334/85

(58) Field of Classification Search ........ 257/E23.062, 257/E23.114, 678, 758, 704, 710, 659, 723, 257/778; 361/707, 794, 816–818, 306.3, 361/728, 720, 763; 174/255, 260, 386; 334/85; 333/12, 22 R; 365/51
See application file for complete search history.

(56) References Cited

U.S. PATENT DOCUMENTS

| | | | |
|---|---|---|---|
| 5,270,493 A * | 12/1993 | Inoue et al. ................. 174/253 |
| 5,566,040 A | 10/1996 | Cosquer et al. | |
| 5,741,729 A * | 4/1998 | Selna .......................... 438/125 |
| 5,880,403 A * | 3/1999 | Czajkowski et al. ........ 174/387 |
| 6,188,297 B1 * | 2/2001 | Akiba .......................... 333/12 |
| 6,329,604 B1 * | 12/2001 | Koya ........................... 174/255 |
| 6,418,032 B2 * | 7/2002 | Hirata et al. ................ 361/780 |
| 6,700,076 B2 * | 3/2004 | Sun et al. .................... 174/262 |
| 6,707,685 B2 * | 3/2004 | Kabumoto et al. .......... 361/794 |
| 6,828,514 B2 * | 12/2004 | Chan et al. ................. 174/262 |
| 6,847,527 B2 * | 1/2005 | Sylvester et al. ........... 361/763 |
| 2004/0027819 A1 | 2/2004 | Berberich | |

FOREIGN PATENT DOCUMENTS

DE     198 02 089     7/1999

* cited by examiner

*Primary Examiner*—Kenneth Parker
*Assistant Examiner*—Chris C. Chu
(74) *Attorney, Agent, or Firm*—Cohen Pontani Lieberman & Pavane LLP

(57) ABSTRACT

An electrical circuit includes a multilayer printed circuit board and a housing which shields against electromagnetic interference. A portion of at least one outer layer of the printed circuit board are in the form of contact areas which are connected to a respective conductor area on a further layer of the printed circuit board. The conductor area occupies an area region that is offset with respect to the contact area and forms a bushing capacitor with a ground area of the outer layer.

6 Claims, 1 Drawing Sheet

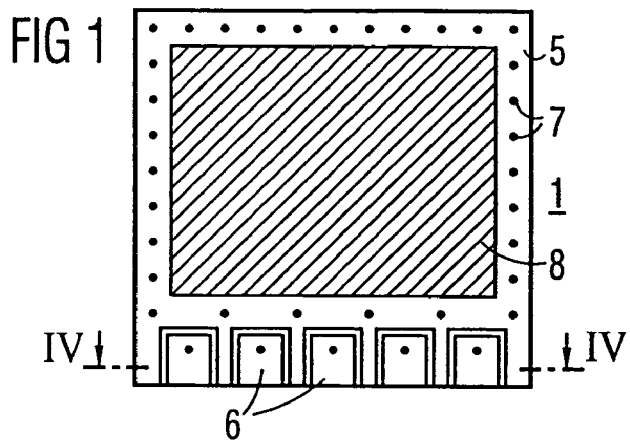
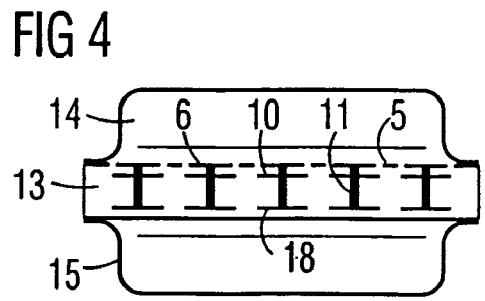
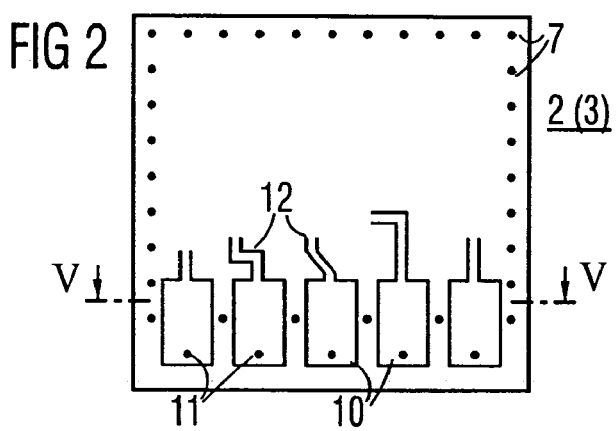
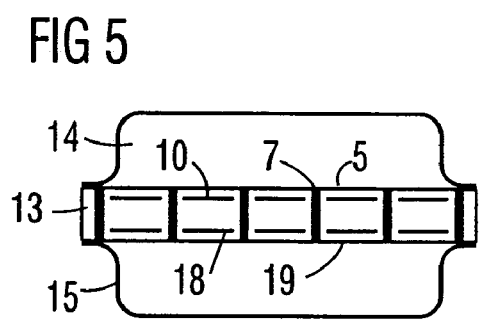
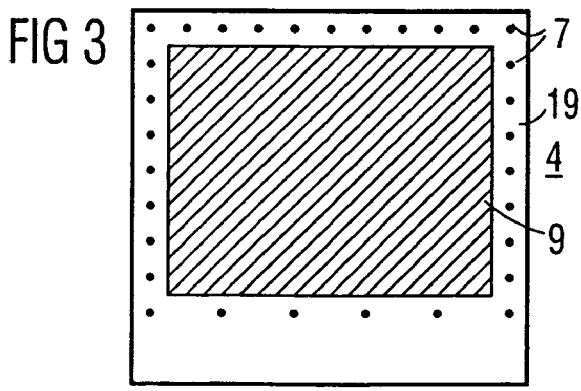
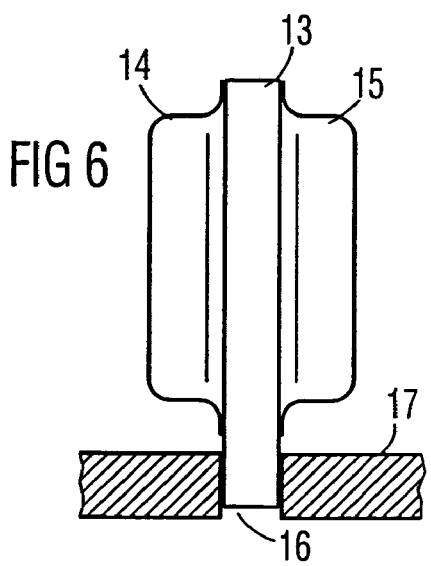

ELECTRICAL CIRCUIT HAVING A MULTILAYER PRINTED CIRCUIT BOARD

BACKGROUND OF THE INVENTION

The invention relates to an electrical circuit having a multilayer printed circuit board and a housing which shields against electromagnetic interference.

The increasing use of highly sensitive electronic assemblies is giving rise to electromagnetic compatibility problems. In a motor vehicle, for example, interference sources are thus situated in a very confined space with circuits which process low output signals from sensors and are still intended to operate in an extremely reliable manner here. In addition to shielding circuits of this type using suitable housings, bushing capacitors are arranged in the supply lines and outgoing lines of these assemblies for reducing problems caused by electromagnetic compatibility.

SUMMARY OF THE INVENTION

It is an object of the present invention to specify an electrical circuit which is insensitive to interference and can be produced with as little outlay as possible.

The object is met by an electrical circuit in which parts of an outer layer of a printed circuit board are in the form of contact areas which are contact-connected to a respective conductor area on a further layer, the conductor area occupying an area region that is offset with respect to the contact area and forming a bushing capacitor with an opposite ground area on the outer layer of the printed circuit board.

The circuit according to the invention can be produced using those operations which are used to produce the circuit as such, namely the production of the multilayer printed circuit board and plated-through holes from one layer to the other, without having to assemble individual additional components. This results in a cost advantage and in an increase in reliability.

According to an embodiment of the invention the conductor areas which are contact-connected to a respective contact area are arranged on a second layer adjacent to the outer layer. This embodiment makes use of the fact that, in multilayer circuits, the outer layers usually have a substantially smaller spacing of, for example, 100 μm than the middle layers whose spacing is 1 mm, for example. This results in sufficiently high capacitances of the bushing capacitors in conjunction with a low area requirement.

According to another embodiment of the present invention, the shielding effect is improved by virtue of the fact that edge regions of the at least one outer layer, which are not occupied by contact areas, form ground areas for contact-connecting housing shells. In this case, provision is preferably made for the ground areas of the two outer layers to be through-plated at regular intervals.

According to another embodiment of the circuit according to the present invention, the contact areas are arranged on one of the outer layers and are contact-connected to a respective conductor area on the adjacent second outer layer and to a conductor area on a third layer which is adjacent to the other outer layer of the printed circuit board. The two conductor areas form bushing capacitors with respective ground areas on the respective adjacent outer layers. This doubles the capacitances.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements through out the several views:

FIG. 1 is a schematic plan view of a first layer of the electric circuit according to the present invention;

FIG. 2 is a schematic plan view of a second layer of the electric circuit of the present invention;

FIG. 3 is a schematic plan view of further layer of a multilayer printed circuit board of a circuit according to the invention;

FIG. 4 is a cross-sectional view of the electric circuit of FIGS. 1-3, along line IV-IV shown in FIG. 1;

FIG. 5 is a cross-sectional view of the electric circuit of FIGS. 1-3, along line V-V shown in FIG. 2, and FIG. 6 is a side view of the circuit of FIGS. 1-3 mounted in a main circuit board.

DETAILED DESCRIPTION OF THE PRESENTLY PREFERRED EMBODIMENTS

The first layer 1 of a printed circuit board shown in FIG. 1 includes interconnects 5 provided at the edges thereof which constitute ground areas. Five contact areas 6 which are insulated from the interconnects 5 are situated only at that edge which is illustrated at the bottom of FIG. 1. Plated-through holes 7 (represented as block dots in the interconnects) are connected to ground areas 19 on other layers such as, for example, the layer 4 shown in FIG. 3. The areas 8, 9 which are illustrated by the shading in FIGS. 1 and 3 represent components which are not illustrated in the Figures. The second layer 2 and a third layer 3 in FIG. 2 (the second and third layers are similar in structure and therefore a plan view of layer 3 is not separately illustrated) are situated between the layers 1 and 4 and have conductor areas 10 which are in the form of capacitor plates. The conductor areas 10 are connected to the contact areas 6 (FIG. 1) using plated-through holes 11.

Interconnects 12 which, starting from the conductor areas 10, form the structure of the circuit. Only portions of the interconnects proximate the conductor areas 10 are indicated in FIG. 2.

FIG. 4 shows a section of the printed circuit board 13 along line IV-IV of FIG. 1. FIG. 4 also illustrates two housing shells 14, 15. FIG. 5 shows a section V-V of FIG. 2. The third layer 3 having conductor areas 18 can also be seen in FIGS. 4 and 5.

FIG. 6 represents a circuit according to the invention which is inserted into a slot 16 in a main printed circuit board 17, the contact areas 6 being connected, in a known manner, to corresponding contacts of the main printed circuit board 17, which are not illustrated in detail.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electrical circuit comprising:
   a multilayer printed circuit board and a housing which shields against electromagnetic interference, said multiplayer printed circuit board including:
   a first layer comprising an outer layer of said printed circuit board, a portion of said outer layer including a plurality of contact areas, said outer layer also including a ground area; and
   a second layer comprising a plurality of conductor areas, each of said plural conductor areas being in respective contact with one of said plural contact areas, and each of said plural conductor areas occupying a region that is offset with respect to each of said plural contact areas, said region opposing at least a portion of said ground area of said outer layer, wherein each of said plural conductor areas form a bushing capacitor with said ground area of said outer layer in said region offset with respect to each of said plural contact areas.

2. The electrical circuit of claim 1, wherein said second layer of said multilayer printed circuit board is adjacent to said outer layer.

3. The electrical circuit of claim 1, wherein said housing comprises housing shells and said outer layer comprises edge regions which are not occupied by said plural contact areas forming ground areas for contacting at least one of said housing shells.

4. The electrical circuit of claim 3, wherein said printed circuit board has two outer layers, wherein each of said outer layers comprises ground areas along edge regions thereof, said ground areas being through-plated at regular intervals.

5. The electrical circuit of claim 1, wherein said multilayer printed circuit board further comprises:
   a third layer including a plurality of conductor areas, each of said plural conductor areas of said third layer being in respective contact with one of said plural contact areas of said first layer; and
   a fourth layer comprising a ground area, said second layer being adjacent to said first layer and said third layer being adjacent to said fourth layer, wherein each of said plural conductor areas in said second and said third layers form bushing capacitors with respective ones of said ground areas on said first and fourth layers.

6. The electrical circuit of claim 1, wherein the plural conductor areas are respectively conductively connected with each of said plural contact areas by a plated-through hole in said multi-layer printed circuit board.

* * * * *